United States Patent
Ohuchi (10) Patent No.: US 6,181,003 B1
(45) Date of Patent: Jan. 30, 2001

(54) SEMICONDUCTOR DEVICE PACKAGED IN PLASTIC PACKAGE

(75) Inventor: Shinji Ohuchi, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 08/925,092

(22) Filed: Sep. 8, 1997

(30) Foreign Application Priority Data

Feb. 21, 1997 (JP) .................................................. 9-038195

(51) Int. Cl.[7] .............................. H01L 23/48; H01L 21/60
(52) U.S. Cl. ...................... 257/690; 257/690; 257/692; 257/696; 257/695
(58) Field of Search .................................... 257/690, 692, 257/696, 695, 666, 693, 694, 697, 698, 777, 778

(56) References Cited

U.S. PATENT DOCUMENTS

| | | | |
|---|---|---|---|
| 5,053,852 | * 10/1991 | Biswas et al. | 257/690 |
| 5,200,364 | * 4/1993 | Loh | 257/696 |
| 5,291,038 | * 3/1994 | Hanamoto et al. | 257/82 |
| 5,548,087 | * 8/1996 | Dahinger | 257/692 |
| 5,600,179 | * 2/1997 | Suzuki | 257/690 |
| 5,844,307 | * 12/1998 | Suzuki et al. | 257/690 |

* cited by examiner

Primary Examiner—Leo P. Picard
Assistant Examiner—Hung Van Duong
(74) Attorney, Agent, or Firm—Jones Volentine, L.L.P.

(57) ABSTRACT

A semiconductor device packaged in a plastic package, the semiconductor device being provided with a semiconductor device chip further provided with plural leads arranged along the top surface of the semiconductor device chip and a plastic mold covering the semiconductor device chip, wherein the plastic mold is limited to the top surface of the semiconductor device chip and the shape of the leads is J-shape or U-shape, whereby the connection between the leads and a printed board is made strong, resulting enhanced reliability of the semiconductor device from the electrical and mechanical viewpoints.

3 Claims, 8 Drawing Sheets

SEMICONDUCTOR DEVICE PACKAGED IN PLASTIC PACKAGE

FIELD OF THE INVENTION

This invention relates to an improvement applicable to a semiconductor device packaged in a plastic package and to a method for producing a semiconductor device packaged in a plastic package. More specifically, this invention relates to an improvement applicable to a semiconductor device packaged in a plastic package and a method for production thereof, the improvement being developed to increase the reliability thereof by reducing possibilities in which a solder layer connecting a lead and a foot print of a printed board is cracked, resulting in an incomplete mechanical and electrical connection between a lead and a printed board.

BACKGROUND OF THE INVENTION

In the wake of the quick development in the technical field of an IC, a memory card and the like, requirement to make them thinner and smaller in size is increasingly more severe. Such a requirement is directed also to a semiconductor device employable for an IC and/or a memory card.

Figure 1:
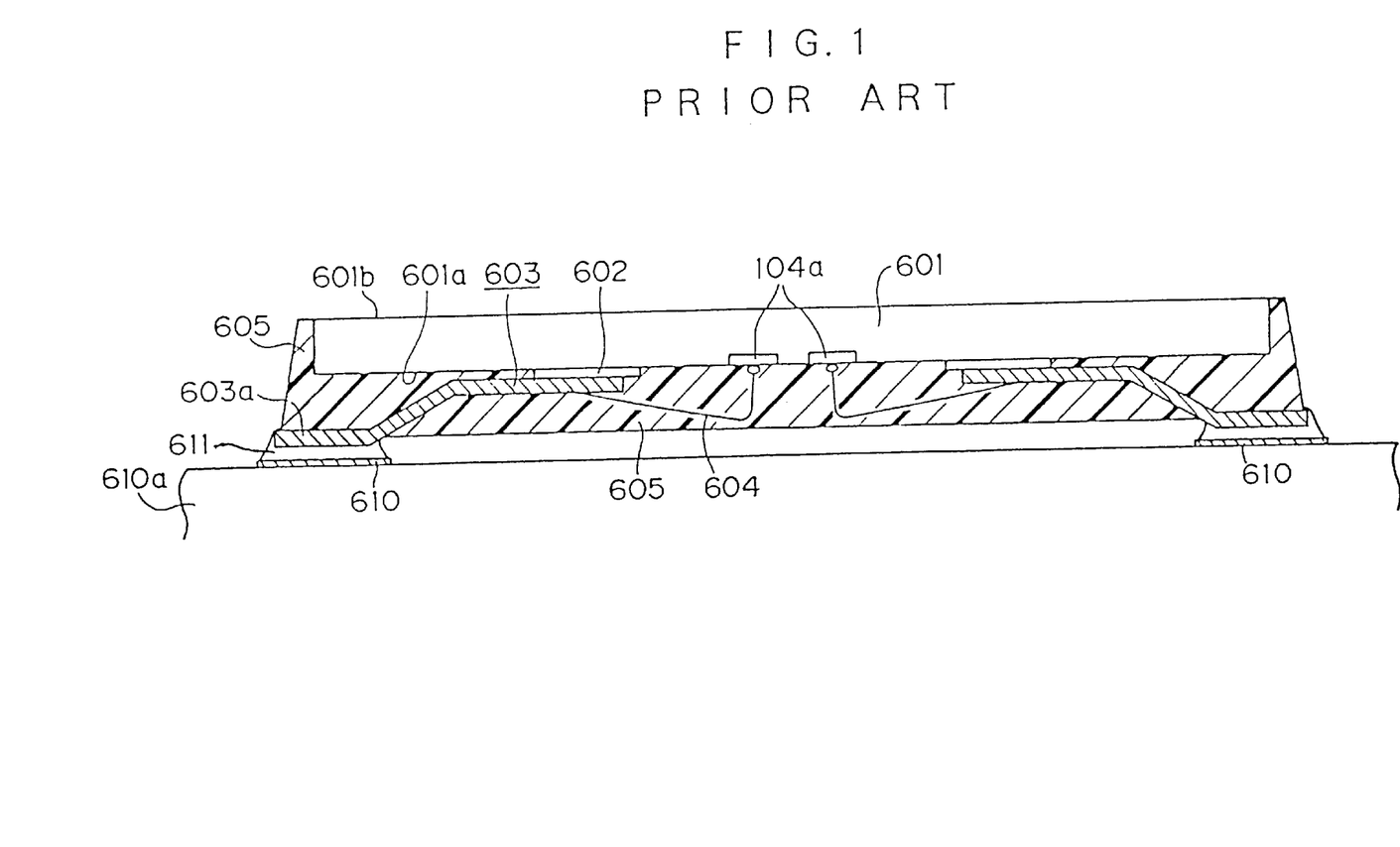
FIG. 1 is a cross section of a semiconductor device packaged in a plastic package available in the prior art, the semiconductor device being mounted on a printed board.

Referring to FIG. 1 illustrating a cross section of a semiconductor device packaged in a plastic package available in the prior art, a plurality of leads 603 (The leads 603 are arranged on a semiconductor device chip in parallel to one another.) are adhered to the top surface 601a (the surface under which monolithic electronic components are produced and actually the bottom surface in FIG. 1) of a semiconductor device chip 601 by employing an adhesive tape e.g. polyimide resin type 602. Each of the leads 603 is bonded with each of bonding pads 104a produced on the top surface of the semiconductor device chip 601, by an Au wire 604. The semiconductor device chip 601 provided the leads 603 is molded in a plastic mold e.g. a mold of polyimide resin 605, remaining the top surface of the ends 603a of the leads 603 and the bottom surface 601b of the semiconductor device chip 601 unmolded. Although the thickness of the plastic mold 605 is in the range of 0.3–0.4 mm in the vertical direction, it is marginal on the side surface of the semiconductor device chip 601. This is for the purpose to make the thickness of a finished semiconductor device packaged in a plastic package thin and to make the horizontal area thereof small.

After turning the finished semiconductor device packaged in a plastic package upside down, the ends 603a of the leads 603 are soldered with foot prints 610 arranged on a printed board 610a. In this manner, electric connection is secured between the end 603a of the lead 603 and the foot prints 610 by means of a solder lump 611.

Since a semiconductor device chip 601 is mounted on a printed board in an upside-down position, and since the bottom surface thereof is not covered by a plastic mold e.g. a mold of polyimide resin 605 in the prior art, the thickness of a finished semiconductor device packaged in a plastic package is sizably reduced.

The foregoing semiconductor device packaged in a plastic package available in the prior art is, however, involved with a drawback wherein the solder lumps 611 connecting the end 603a of the leads 603 and the foot print 610 arranged on the printed board 610a is inclined to be cracked, resulting in unsatisfactory mechanical and electric connection between the end 603a and the foot print 610. This is of course a parameter to degrade the reliability of a semiconductor device packaged in a plastic package from electrical and mechanical viewpoints.

This adverse phenomenon is assumed to be caused by large difference in coefficient of thermal expansion between a semiconductor device chip and a printed board and by weak connection between a lead 603 and a foot print 610. In other words, the length of a lead 603 is designed to be short for the purpose to reduce the horizontal area of a semiconductor device packaged in a plastic package. Therefore, it is difficult for the lead 603 to absorb a stress derived from a difference in coefficient of thermal expansion between a semiconductor device chip and a printed board. In addition, a small area of the end 603a of a lead 603 which is caused by the design in which the length of the lead 603 is made short, causes to make the connection strength weak between the end 603a of a lead 603 and the foot print 610.

In the foregoing environments, development of a semiconductor device packaged in a plastic package, wherein the connection between a lead and a printed board is strong, thereby the semiconductor device packaged in a plastic package is reliable from electrical and mechanical viewpoints is strongly required.

OBJECTS AND SUMMARY OF THE INVENTION

Accordingly, an object of this invention is to provide a semiconductor device packaged in a plastic package, wherein the connection between a lead and a printed board is strong, thereby the semiconductor device packaged in a plastic package is reliable from electrical and mechanical viewpoints.

The other object of this invention is to provide a method employable for producing the foregoing semiconductor device packaged in a plastic package.

To achieve the first one of the foregoing objects, a semiconductor device packaged in a plastic package in accordance with a first embodiment of this invention comprising:

a semiconductor device chip, a plurality of leads arranged along the top surface of the semiconductor device chip in parallel to one another from the central part of the semiconductor device chip toward the edge of the semiconductor device chip, a plastic mold covering the top and side surfaces of the semiconductor device chip, wherein each of the leads is bent at location close to the edge of the semiconductor device chip or at location which is not so remote from the edge of the semiconductor device chip, to make the shape of the lead a J-shape and to cause the end of the lead to cover the top surface of the plastic mold.

To achieve the first one of the foregoing object, a semiconductor device packaged in a plastic package in accordance with a second embodiment of this invention comprising:

a semiconductor device chip, a plurality of leads arranged along the top surface of the semiconductor device chip in parallel to one another from the central part of the semiconductor device chip toward the edge of the semiconductor device chip, a plastic mold covering the top and side surfaces of the semiconductor device chip, wherein the plastic mold produced on the top surface of the semiconductor device chip is limited to the central part of the semiconductor device chip and each of the leads is bent at the edge of the plastic mold produced on the central part of the top surface of the semiconductor device chip, to make the shape of the lead a U-shape and to cause the end of the lead to cover the top surface of the plastic mold.

To achieve the first one of the foregoing object, a semiconductor device packaged in a plastic package in accordance with a third embodiment of this invention comprising:

a semiconductor device chip, a plurality of leads arranged along the top surface of the semiconductor device chip in parallel to one another from the central part of the semiconductor device chip toward the edge of the semiconductor device chip, a plastic mold covering the top and side surfaces of the semiconductor device chip, wherein the plastic mold produced on the top surface of the semiconductor device chip is limited to the central part of the semiconductor device chip and each of the leads is bent at location close to the edge of the semiconductor device chip or at location slightly remote from the edge toward the central part of the semiconductor device chip, not to cover the top surface of the plastic mold.

In any of the semiconductor devices packaged in a plastic package in accordance with the first through third embodiments of this invention, it is practical to use epoxy resin for the plastic mold.

In any of the semiconductor devices packaged in a plastic package in accordance with the first through third embodiments of this invention, it is practical to adhere the leads to the semiconductor device chip by employing an adhesive tape e.g. a polyimide resin tape.

To achieve the foregoing other object of this invention, a method employable for producing a semiconductor device packaged in a plastic package in accordance with a first embodiment of this invention comprising:

a step for adhering each of linear leads on the top surface of the semiconductor device chip, a step for bonding each of the linear leads with a bonding wire, a step for covering the semiconductor device chip by a plastic mold, and a step for bending the linear leads into a J-shape or a U-shape.

In the method for producing a semiconductor device packaged in a plastic package in accordance with a first embodiment of this invention, the plastic mold can be made of epoxy resin.

In the method for producing a semiconductor device packaged in a plastic package in accordance with a first embodiment of this invention the lead can be adhered to the semiconductor device chip by employing an adhesive tape e.g. a polyimide resin tape.

In the method for producing a semiconductor device packaged in a plastic package in accordance with the first and second embodiments of this invention, the step for covering the semiconductor device chip by a plastic mold can be followed by a baking process, and the step for bending the linear leads can be conducted at location close to the edge of the semiconductor device chip.

In the method for producing a semiconductor device packaged in a plastic package in accordance with the first and second embodiments of this invention, the step for bending the linear leads can further be provided with a step for peeling the linear lead form the plastic mold and a step for bending the linear lead at location remote from the edge toward the central part of the semiconductor device chip, and can further be provided with a step for baking the plastic mold, the step for baking being conducted after the step for bending the linear lead is finished.

Further, this invention can be described as a semiconductor device chip having a plurality of electrodes, a plurality of leads having first and second ends, the first end being disposed over the top surface of the semiconductor device chip, and the second end being bent to the direction opposite to the first end, plurality of conductor members connecting the electrodes and the leads, and a plastic mold covering the electrodes and the first end of the leads.

In the foregoing semiconductor device, the second end of the leads can be disposed on the plastic mold.

In the foregoing semiconductor device, the second end of the leads can be disposed over the first end of the leads, as well.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS OF THIS INVENTION

Referring to drawings, a detailed description will be presented below for three semiconductor devices packaged in plastic package and this methods for producing them in accordance with three independent embodiments of this invention.

In the following embodiments, the dimension of a semiconductor device chip is assumed to be 15 mm in length, 6 mm in width and 0.3 mm in thickness. The thickness of a plastic mold is assumed to be in the range of 0.3 through 0.4 mm for any embodiment. Coefficient of linear expansion is assumed to be $3 \times 10^{31}$ $^6/°$ C. for an Si substrate, $4 \times 10^{31}$ $^6/°$ C. for a lead made of an alloy containing 42% of Ni and 58% of Fe and $10 \times 10^{-6}/°$ C. for a plastic mold made of epoxy resin.

First Embodiment

A semiconductor device packaged in a plastic package provided with J-shaped leads.

Figure 2:
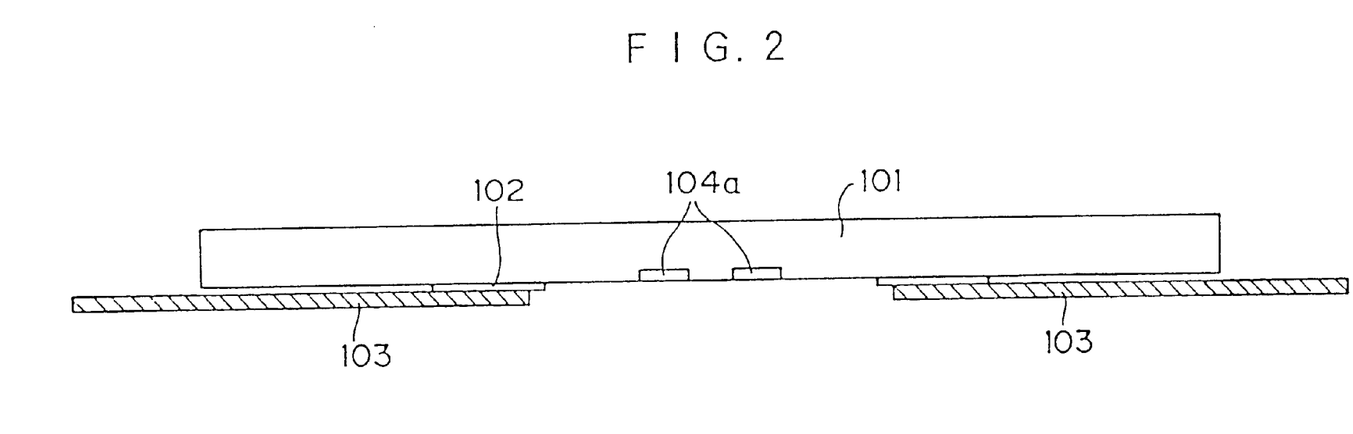
FIG. 2 is a cross section of a semiconductor device packaged in a plastic package in accordance with a first embodiment of this invention, under progress of production.

Referring to FIG. 2, each of plural leads made of an alloy containing 42% Ni and 58% Fe and having the coefficient of linear expansion of $4 \times 10^{-6}/°$ C. 103 is adhered to the top surface (the rear surface in the drawings) of a semiconductor device chip of which the dimension is 15 mm in length, 6 mm in width and 0.3 mm in thickness 101 by employing an adhesive tape e.g. a polyimide tape 102. The leads 103 are arranged in parallel to one another. The length of the leads 103 is long enough to allow to be bent. The coefficient of linear expansion is $3 \times 10^{-6}/°$ C. for an Si substrate of the semiconductor device chip 101 and is $10 \times 10^{-6}/°$ C. for epoxy resin.

Figure 3:
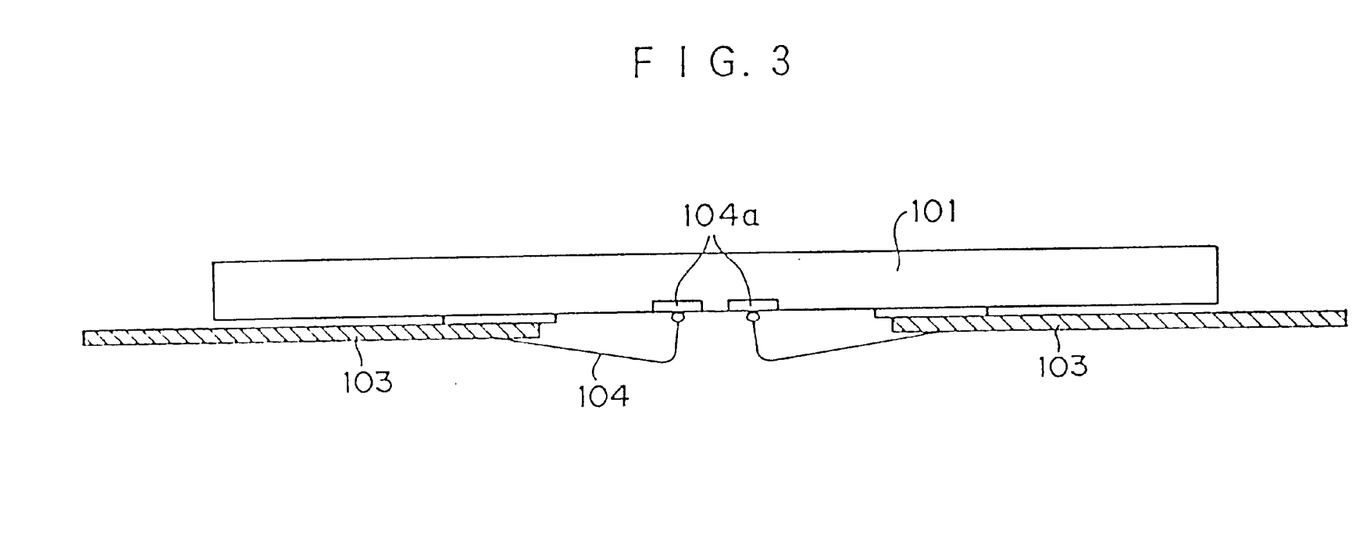
FIG. 3 is a cross section of a semiconductor device packaged in a plastic package in accordance with a first embodiment of this invention, under progress of production.

Referring to FIG. 3, each of the leads 103 is bonded with each of bonding pads 104a produced on the top surface of the semiconductor device chip 101, by an Au wire 104.

Figure 4:
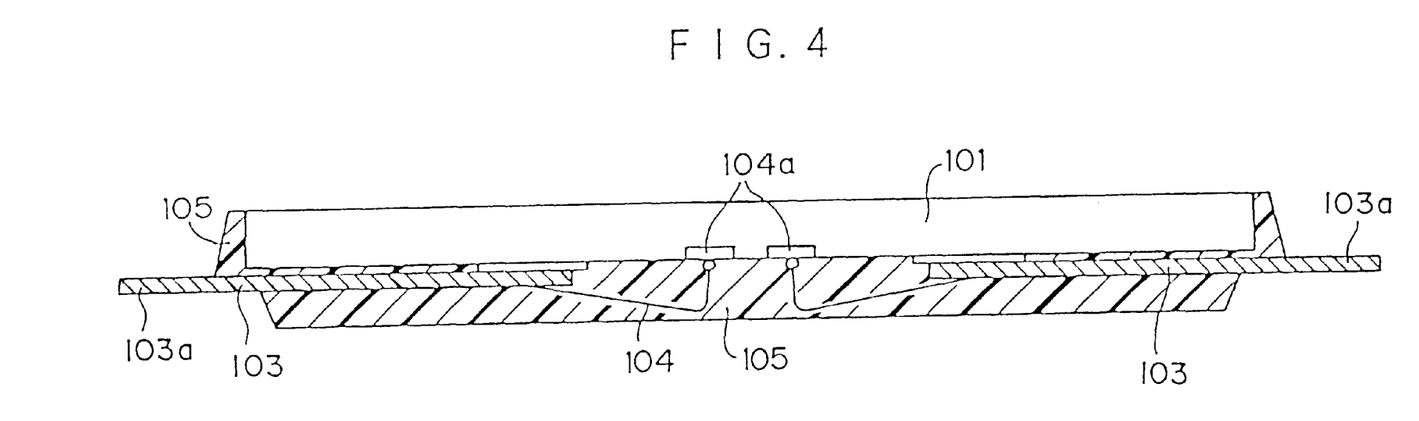
FIG. 4 is a cross section of a semiconductor device packaged in a plastic package in accordance with a first embodiment of this invention, under progress of production.

Referring to FIG. 4, a molding process is conducted to cover the top and side surfaces of the semiconductor device chip 101. The thickness of plastic mold 105 is relatively thin for the purpose to make the horizontal dimension and thickness of a finished semiconductor device packaged in a plastic package small. The thickness of the plastic mold 105 is in the range of 0.3 through 0.4 mm. As a result, the end 103a of the lead 103 projects from the plastic mold 105, to the right and left in the drawing.

Figure 5:
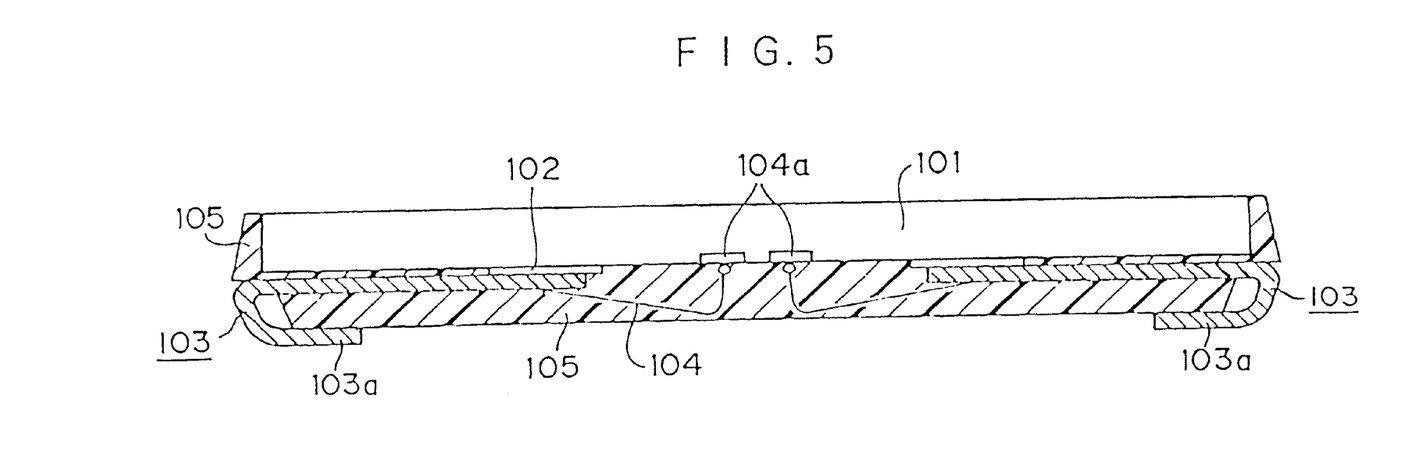
FIG. 5 is a cross section of a finished semiconductor device packaged in a plastic package in accordance with a first embodiment of this invention.

Referring to FIG. 5 the end 103a of each of the leads 103 is bent to allow the end 103a to cover the top surface of the plastic mold 105. The end 103a of the leads 103 is not fixed to the top surface of the plastic mold 105. In this manner, a semiconductor device packaged in a plastic package and provided with J-shaped leads 103 in accordance with a first embodiment of this invention is finished.

Figure 6:
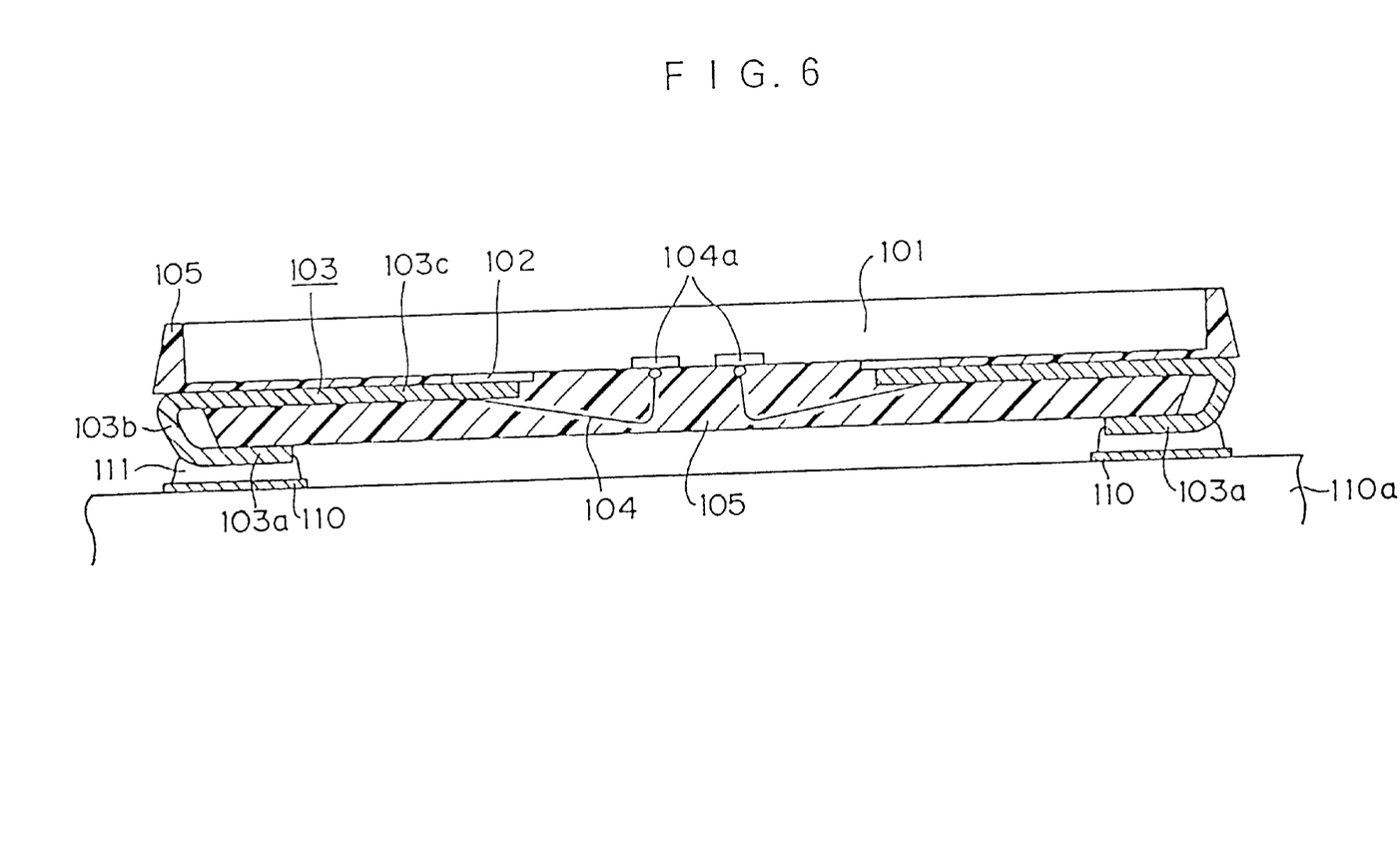
FIG. 6 is a cross section of a finished semiconductor device packaged in a plastic package in accordance with a first embodiment of this invention, the semiconductor device being mounted on a printed board.

Referring to FIG. 6, the finished semiconductor device packaged in a plastic package and provided with J-shaped leads is mounted on a printed board 110a in a manner described below. The top surface of the ends 103a of the leads 103 are soldered to foot prints 110 produced on the printed board 110a, after the semiconductor device packaged in a plastic package and provided with J-shaped leads is turned upside down.

As is shown in FIG. 6, the lead 103 is longer than that of the prior art and has a bow portion or a bent portion 103b between the end 103a and the main body 103c of the lead 103. This shape allows a large magnitude of flexibility for the lead 103. As a result, potential stress generated and stored in a solder 111 caused by difference in coefficient of thermal expansion between the semiconductor device chip and the printed board, is readily absorbed in the lead 103, resultantly decreasing the possibility in which the solder 111 is cracked to cause unsatisfactory mechanical and electrical connection between the lead 103 and the foot print 110. It is noted that the coefficient of linear expansion is $3 \times 10^{-6}/°$ C. for an Si substrate of the semiconductor device chip 101, $4 \times 10^{-6}/°$ C. for the leads 103 made of an alloy containing 42% Ni and 58% Fe and $10 \times 10^{-6}/°$ C. for the plastic mold 105 made of epoxy resin. It is emphasized that the foregoing shape of the leads 103 is effective also for the purpose to reduce the horizontal dimension of the semiconductor device packaged in a plastic package and provided with J-shaped leads. $4 \times 10^{31}$ $^6/°$ C. for the leads 103 made of an alloy 42% Ni and 58% Fe and $10 \times 10^{-6}/°$ C. for the plastic mold 165 made of epoxy resin. It Second Embodiment A semiconductor device packaged in a plastic package provided with U-shaped leads, the U-shaped leads being arranged remote form the edge of the semiconductor device.

Figure 7:
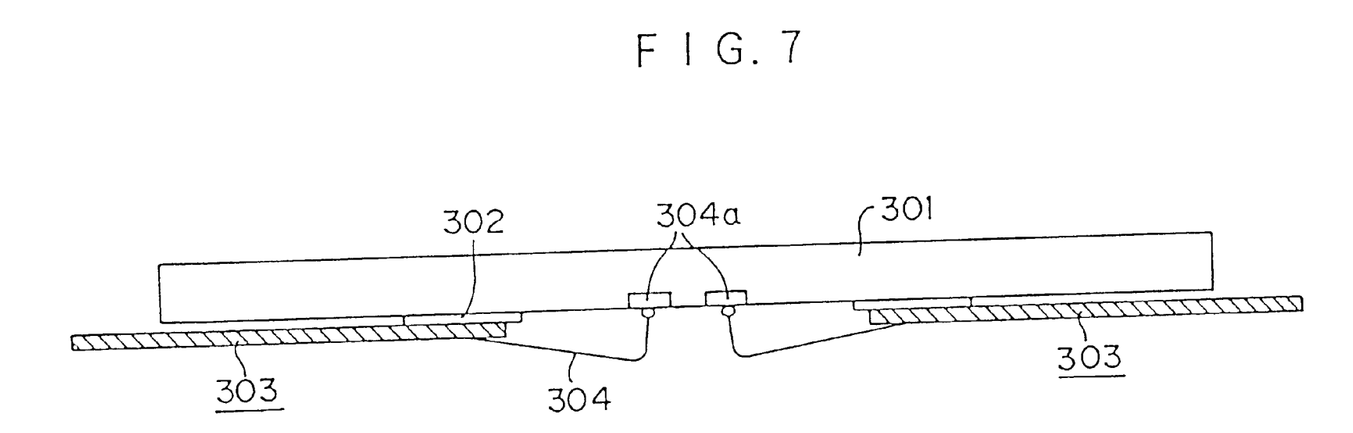
FIG. 7 is a cross section of a semiconductor device packaged in a plastic package in accordance with a second embodiment of this invention, under progress of production.

Referring to FIG. 7, each of plural leads 303 is adhered to the top surface (the bottom surface in the drawings) of a semiconductor device chip 301 by employing an adhesive tape e.g. a polyimide tape 302. The length of the lead 303 is much shorter than that of the first embodiment. Each of the leads 303 is bonded with each of bonding pads 304a produced on the top surface of the semiconductor device chip 301, by employing an Au wire 304.

Figure 8:
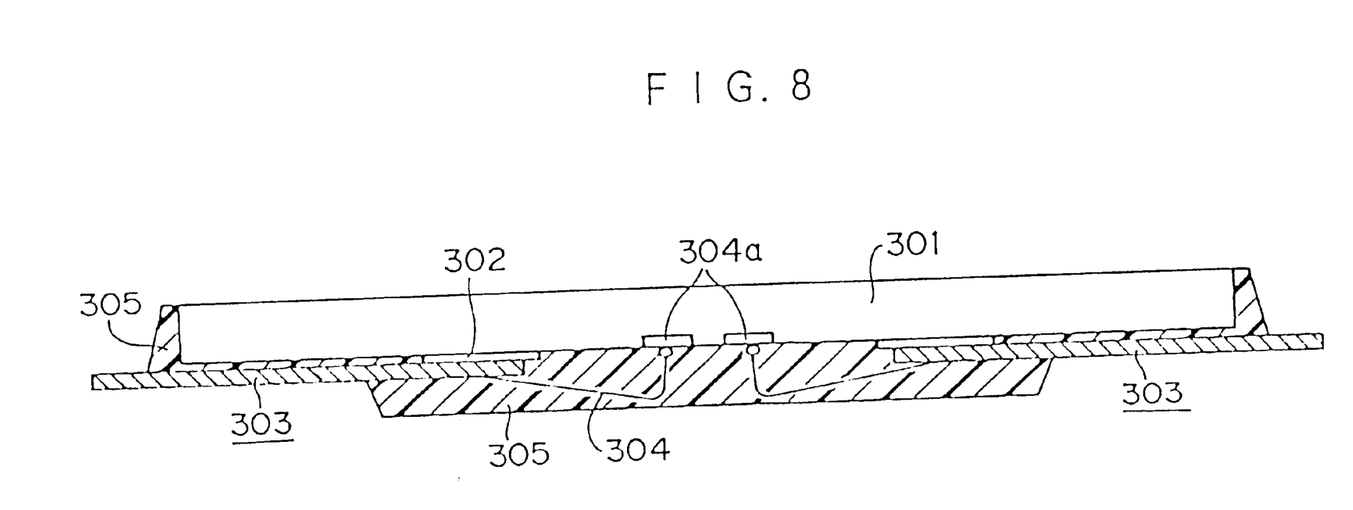
FIG. 8 is a cross section of a semiconductor device packaged in a plastic package in accordance with a second embodiment of this invention, under progress of production.

Referring to FIG. 8, a molding process is conducted to cover the central area of the top surface of and the side surface of the semiconductor device chip 301. Epoxy resin is employed for the plastic mold. Attention is paid to make the thickness of a plastic mold 305 produced along the side of the semiconductor device chip 301 thin e.g. 0.3 through 0.4 mm for the purpose to make the horizontal dimension of the semiconductor device small. In this molding process, the space between the top surface of the semiconductor device chip 301 and the leads 303 is filled by the plastics or by epoxy resin in this example.

Figure 9:
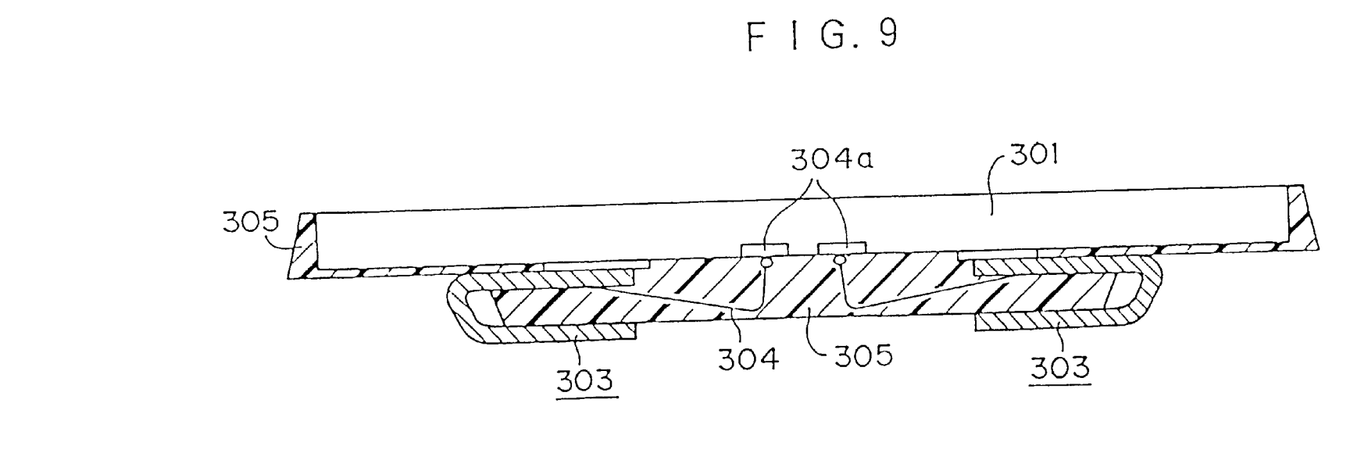
FIG. 9 is a cross section of a finished semiconductor device packaged in a plastic package in accordance with a second embodiment of this invention.

Referring to FIG. 9, a part of the leads 303 which is not adhered to the semiconductor device chip 301 by the adhesive tape e.g. polyimide resin tape 302 is peeled from the thin plastic mold 305 produced along the top surface of the semiconductor device chip 301 and folded toward the top surface of the plastic mold 305, resultantly making U-shaped leads 303. The end of the leads 303 is not fixed to the top of the plastic mold 305. In this manner, a semiconductor device packaged in a plastic package and provided with U-shaped leads 303 is finished.

Figure 10:
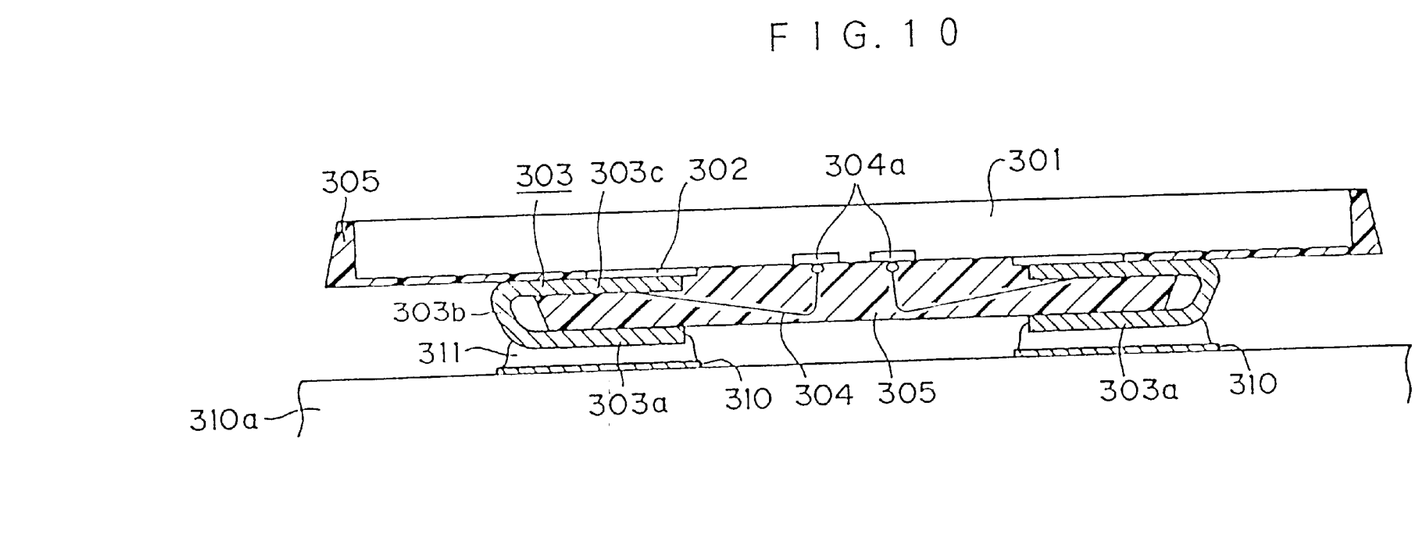
FIG. 10 is a cross section of a finished semiconductor device packaged in a plastic package in accordance with a second embodiment of this invention, the semiconductor device being mounted on a printed board.

Referring to FIG. 10, the finished semiconductor device packaged in a plastic package and provided with U-shaped leads is mounted on a printed board 310a in a manner described below. The top surface of the folded ends 303a of the leads 303 are soldered to foot prints 310 produced on the printed board 310a, after the semiconductor device packaged in a plastic package and provided with U-shaped leads is turned upside down.

Referring again to FIG. 10, since the lead 303 consists of the folded end 303a, a bent portion 303b and a main body 303c, the lead 303 is fairly flexible. As s result, potential stress generated and stored in a solder lump 311 caused by difference in coefficient of thermal expansion between the semiconductor device chip 301 and the printed board 310a, is readily absorbed in the lead 303, resultantly decreasing the possibility in which the solder 311 is cracked to cause unsatisfactory mechanical and electrical connection between the lead 103 and the foot print 110. It is noted that the coefficient of linear expansion is 3×10⁻⁶/° C. for an Si substrate of the semiconductor device chip 101, 4×10⁻⁶/° C. for the leads 103 made of an alloy containing 42% Ni and 58% Fe and 10×10⁻⁶/° C. for the plastic mold 105 made of epoxy resin. In addition, since the leads 303 are arranged exclusively at the central part of the semiconductor device chip 301, the horizontal dimension of the semiconductor device packaged in a plastic package and provided with U-shaped leads is remarkably reduced.

Third Embodiment

A semiconductor device packaged in a plastic package, the location of the package being limited to the central area of the top surface of a semiconductor device chip, and the semiconductor device being provided with J-shaped leads whose top surface is not higher than the top surface of the package.

Figure 11:
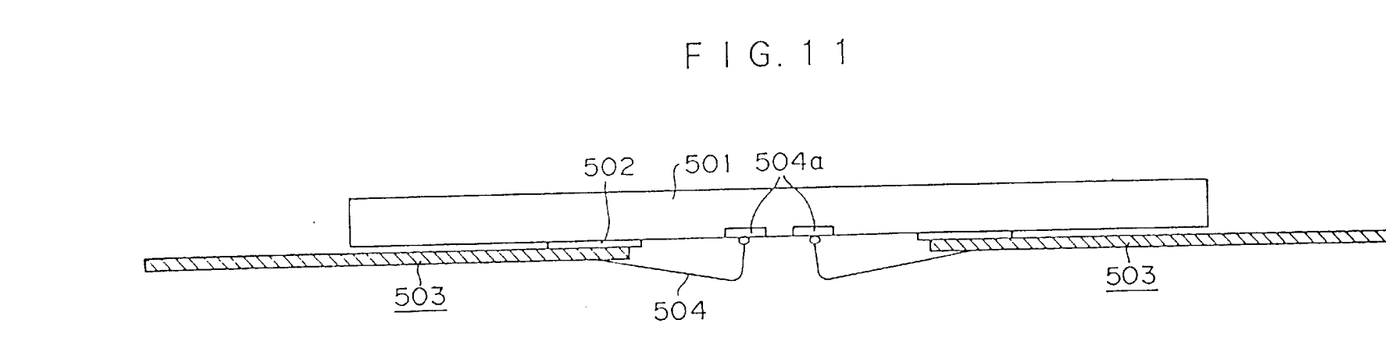
FIG. 11 is a cross section of a semiconductor device packaged in a plastic package in accordance with a third embodiment of this invention, under progress of production.

Referring to FIG. 11, each of plural leads 503 is adhered to the top surface (the rear surface in the drawings) of a semiconductor device chip 501 by employing an adhesive tape e.g. a polyimide tape 502. The length of the lead 503 is long. In other words, the length of the lead 503 is approximately same as that of the first embodiment. Each of the leads 503 is bonded with each of bonding pads 504a produced on the top surface of the semiconductor device chip 501, by employing an Au wire 504.

Figure 12:
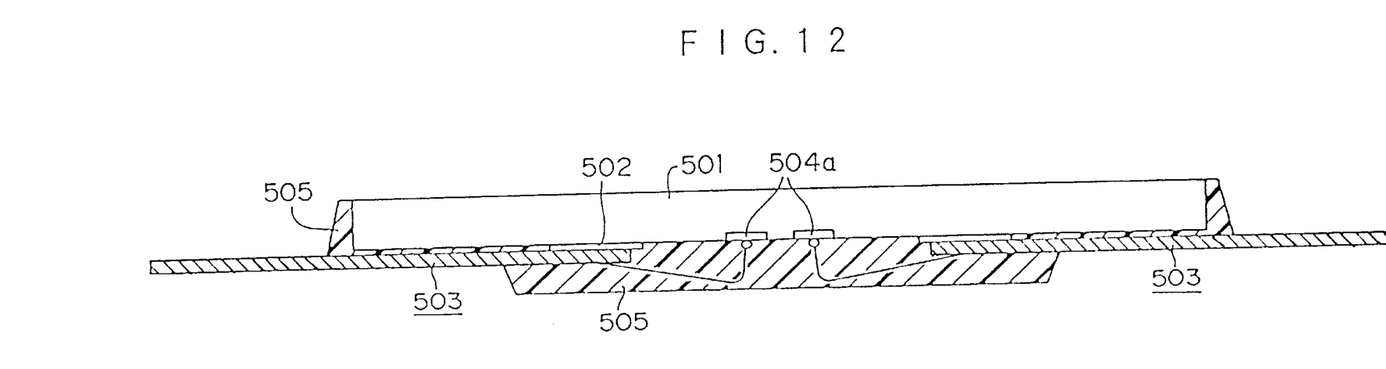
FIG. 12 is a cross section of a semiconductor device packaged in a plastic package in accordance with a third embodiment of this invention, under progress of production.

Referring to FIG. 12, a molding process is conducted to cover the central area of the top surface of and the side surface of the semiconductor device chip 501. The thickness of the plastic mold 505 produced on the side surface of the semiconductor device chip 501 is made thin e.g. 0.3 through 0.4 mm for the purpose to reduce the horizontal dimension of the finished semiconductor device.

Figure 13:
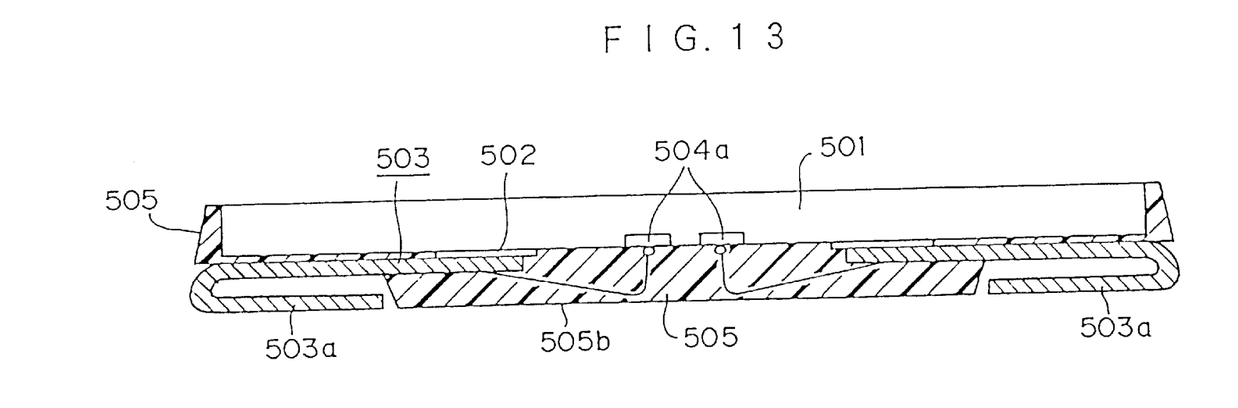
FIG. 13 is a cross section of a finished semiconductor device packaged in a plastic package in accordance with a third embodiment of this invention.

Referring to FIG. 13, the ends 503a is bent by 180° or folded back starting at the location close to the side surface 505a of the plastic mold 505. Attention is paid not to cover the top surface of the plastic mold 505 with the end 503a of the lead 503 for the purpose to make the height of the folded end 503a smaller than that of the top surface 505b of the resin mold 505. Produced in this manner is a semiconductor device packaged in a plastic package, the location of the package being limited to the central area of the top surface of a semiconductor device chip, and the semiconductor device being provided with J-shaped leads whose top surface is not higher than the top surface of the package, in accordance with the third embodiment of this invention.

Figure 14:
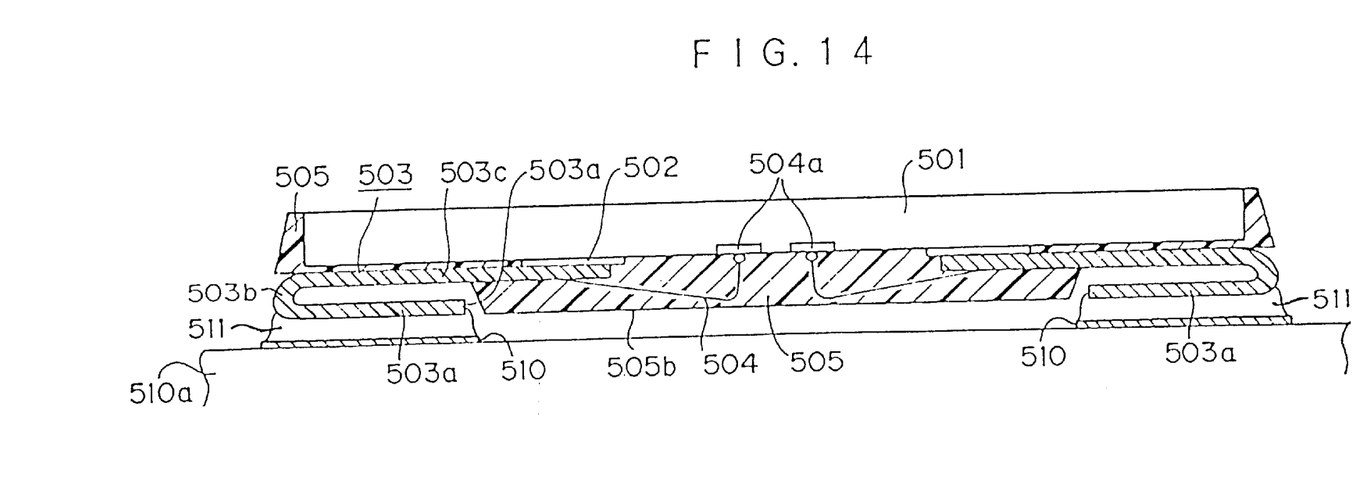
FIG. 14 is a cross section of a finished semiconductor device packaged in a plastic package in accordance with a third embodiment of this invention, the semiconductor device being mounted on a printed board.

Referring to FIG. 14, the finished semiconductor device packaged in a plastic package in accordance with the third embodiment of this invention is mounted on a printed board 510a in a manner described below. The top surface of the folded ends 503a of the leads 503 are soldered to foot prints 510 produced on the printed board 510a, after the semiconductor device packaged in a plastic package is turned upside down.

Referring again to FIG. 14, since the lead 503 consists of the folded end 503a, a bent portion 503b and a main body 503c, the lead 503 is fairly flexible. As a result, potential stress generated and stored in the solder 511 caused by difference in coefficient of thermal expansion between the semiconductor device chip and the printed board, is readily absorbed in the lead 503, resultantly decreasing possibility in which the solder 511 is cracked to cause unsatisfactory mechanical and electrical connection between the lead 503 and with foot print 510. It is noted that the coefficient of linear expansion is 3×10⁻⁶/° C. for an Si substrate of the semiconductor device chip 101, 4×10⁻⁶/° C. for the leads 103 made of an alloy containing 42% Ni and 58% Fe and 10×10⁻⁶/° C. for the plastic mold 165 made of epoxy resin. In addition, since the height of the folded end 503a is smaller than that of the top surface 505b of the resin mold 505, the overall height of the semiconductor device packaged in a plastic package is much smaller than those of the first and second embodiments.

The foregoing description has clarified that a semiconductor device packaged in a plastic package, wherein the connection between a lead and a printed board is strong, thereby the semiconductor device packaged in a plastic package is reliable from electrical and mechanical viewpoints, has successfully been provided by this invention.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor device comprising:
   a semiconductor device chip having a plurality of electrodes disposed on a top surface of said semiconductor device chip:
   a plurality of leads each having a first end and a second end, said first end being disposed on the top surface of said semiconductor device chip, and said second end being folded back at a location close to the edge of said semiconductor device chip, said second end being closer to the top surface of said semiconductor device chip than to a bottom surface of said semiconductor device chip;
   a plurality of conductor members connecting said electrodes and said leads; and
   a plastic mold covering said electrodes and said first end of said leads.

2. A semiconductor device in accordance with claim 1, wherein said second end of said leads is disposed in said plastic mold.

3. A semiconductor device in accordance with claim 1, wherein said second end of said leads is disposed over said first end of said leads.

* * * * *